(12) United States Patent
Asari et al.

(10) Patent No.: US 9,425,074 B2
(45) Date of Patent: Aug. 23, 2016

(54) HEAT TREATMENT APPARATUS

(71) Applicant: TOKYO ELECTRON LIMITED, Tokyo (JP)

(72) Inventors: Shinji Asari, Oshu (JP); Hidekazu Sato, Oshu (JP); Tomohiro Shiobara, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 451 days.

(21) Appl. No.: 13/922,450

(22) Filed: Jun. 20, 2013

(65) Prior Publication Data
US 2014/0373387 A1   Dec. 25, 2014

(30) Foreign Application Priority Data

Jun. 20, 2012   (JP) .................. 2012-138510

(51) Int. Cl.
*F26B 19/00*   (2006.01)
*H01L 21/67*   (2006.01)

(52) U.S. Cl.
CPC .............................. *H01L 21/67109* (2013.01)

(58) Field of Classification Search
CPC ................... H01L 21/67109; H01L 21/67115; F27B 17/0025; F27B 17/0033; F27B 19/00; F27B 21/00
USPC .............................. 34/549, 380, 381; 219/413
See application file for complete search history.

(56) References Cited

U.S. PATENT DOCUMENTS

| 5,172,027 | A | * | 12/1992 | Nonomura | ............ H01J 29/04 313/269 |
| 5,329,095 | A | * | 7/1994 | Okase | .................... C23C 16/46 118/724 |
| 6,239,044 | B1 | * | 5/2001 | Kashiwagi | ............... C23C 8/02 257/E21.279 |
| 2008/0255683 | A1 | * | 10/2008 | Takahashi | .......... G05D 23/1935 700/42 |
| 2009/0170338 | A1 | | 7/2009 | Terasaki et al. | |

FOREIGN PATENT DOCUMENTS

| JP | 09-148315 A | 6/1997 |
| JP | 11-283928 A | 10/1999 |
| JP | 2001-345314 A | 12/2001 |
| JP | 2010-040695 A | 2/2010 |
| WO | 2008/016143 A1 | 2/2008 |

\* cited by examiner

*Primary Examiner* — Kenneth Rinehart
*Assistant Examiner* — John McCormack
(74) *Attorney, Agent, or Firm* — Nath, Goldberg & Meyer; Jerald L. Meyer

(57) ABSTRACT

A heat treatment apparatus performs a heat treatment on a plurality of target objects held by a holding unit while allowing an inert gas to flow upwardly in a vertical processing container with at least one heating unit provided in the vicinity of the processing container. The heat treatment apparatus includes: a main temperature control unit configured to control the heating unit; an inert gas passage through which the inert gas flows into the processing container; an inert gas heating unit installed in the inert gas passage and configured to heat the inert gas; a first temperature measuring unit installed in the inert gas heating unit; and a temperature controller configured to control the inert gas heating unit based on temperatures measured by the first temperature measuring unit.

7 Claims, 3 Drawing Sheets

HEAT TREATMENT APPARATUS

CROSS-REFERENCE TO RELATED APPLICATION

This application claims the benefit of and priority from Japanese Patent Application No. 2012-138510, filed on Jun. 20, 2012, in the Japan Patent Office, the disclosure of which is incorporated herein in its entirety by reference.

TECHNICAL FIELD

The present disclosure relates to a heat treatment apparatus for performing a heat treatment such as sintering or the like on photoresists coated on target objects such as a semiconductor wafer or the like.

BACKGROUND

Generally, in order to manufacture a semiconductor integrated circuit, a variety of treatments; such as film formation treatments, etching treatments using a photolithography technique, oxidation treatments, diffusion treatments and modification treatments; are performed on semiconductor wafers such as silicon substrates or the like. In the photolithography technique, a photoresist is coated on the semiconductor wafers such as the silicon substrates or the like, and then is baked. Thereafter, a mask pattern is transcribed on the photoresist through an exposure process, i.e., by irradiating ultraviolet rays or the like on the photoresist through a photo mask. Finally, a resist pattern is formed by developing the photoresist.

The photoresist is a mixed liquid of, for example, photosensitizer, resins, solvent or the like. After the photoresist is coated on the semiconductor wafers, moisture or volatile components contained in the photoresist are evaporated by performing a pre-bake or a post-bake with respect to the photoresist coated semiconductor wafers. As a result, a thin film of the photoresist is baked as described above.

A vertical heat treatment apparatus is generally used for performing a post-bake as a sintering process because it is capable of baking a plurality of semiconductor wafers simultaneously.

The vertical heat treatment apparatus is configured to support a plurality of semiconductor wafers that have been coated by the photoresist and pre-baked in multi-levels in a vertically cylindrical processing container. The photoresist is baked by heating the processing container using a heater while supplying a large amount of inert gas such as a $N_2$ gas into the processing container and by evacuating moisture or the volatile components generated from the photoresist together with the $N_2$ gas. In the vertical heat treatment apparatus for example, the $N_2$ gas is introduced into a lower region of the processing container, flows upward in the processing container, and is evacuated together with the volatile components.

However, the vertical heat treatment apparatus has a drawback that the lower region of the processing container is likely to become a low temperature region in a cold spot state, because it is difficult to transfer the heat generated by the heater to the lower region and a heat dissipation amount is large in the lower region. Further, vaporized gas including sensitizer components as well as pure volatile components is sometimes generated during the baking process. When the vaporized gas is brought into contact with the low temperature region, the vaporized gas is cooled and powdered or liquefied depositions causing particles adhere to the low temperature region. For example, when a polyimide resin is used as the photoresist, a tar-like liquid including carbon adheres to the low temperature region.

SUMMARY

The various embodiments of the present disclosure provide a heat treatment apparatus capable of suppressing an adherence of powdered or liquefied depositions on a lower region of a processing container.

According to an embodiment of the present disclosure, there is provided a heat treatment apparatus for performing a heat treatment on a plurality of target objects held by a holding unit while allowing an inert gas to flow upwardly in a vertical processing container with a heating unit provided in the vicinity of the processing container. The heat treatment apparatus includes: a main temperature control unit configured to control the heating unit; an inert gas passage through which the inert gas flows into the processing container; an inert gas heating unit installed in the inert gas passage and configured to heat the inert gas; a first temperature measuring unit installed in the inert gas heating unit; and a temperature controller is configured to control the inert gas heating unit based on temperatures measured by the first temperature measuring unit.

According to another embodiment of the present disclosure, there is provided a heat treatment apparatus for performing a heat treatment on a plurality of target objects held by a holding unit by allowing an inert gas to flow upwardly in a vertical processing container with a heating unit provided in the vicinity of the processing container including: a main temperature control unit configured to control the heating unit; an inert gas passage through which the inert gas flows into the processing container; an inert gas heating unit installed in the inert gas passage and configured to heat the inert gas; a first temperature measuring unit located in the inert gas heating unit; a heat insulation heater installed along the inert gas passage between the inert gas heating unit and the processing container; a second temperature measuring unit installed in the heat insulation heater; a lower portion heating unit installed along the circumferential direction of the processing container and configured to heat the inert gas introduced into the processing container; a third temperature measuring unit installed in the lower portion heating unit; a lid heating unit installed in a lid for air-tightly sealing a bottom opening of the processing container; a fourth temperature measuring unit installed in the lid heating unit; and a temperature controller configured to control the inert gas heating unit, the heat insulation heater, the lower portion heating unit and the lid heating unit based on temperatures measured by the first to the fourth temperature measuring unit. When predetermined values of processing temperatures vary during the heat treatment, the temperature controller controls the inert gas heating unit to reflect changes of the predetermined values, and controls at least one of the heat insulation heater, the lower portion heating unit and the lid heating unit to reflect changes of the predetermined values based on the temperatures measured by the second to the fourth temperature measuring unit.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
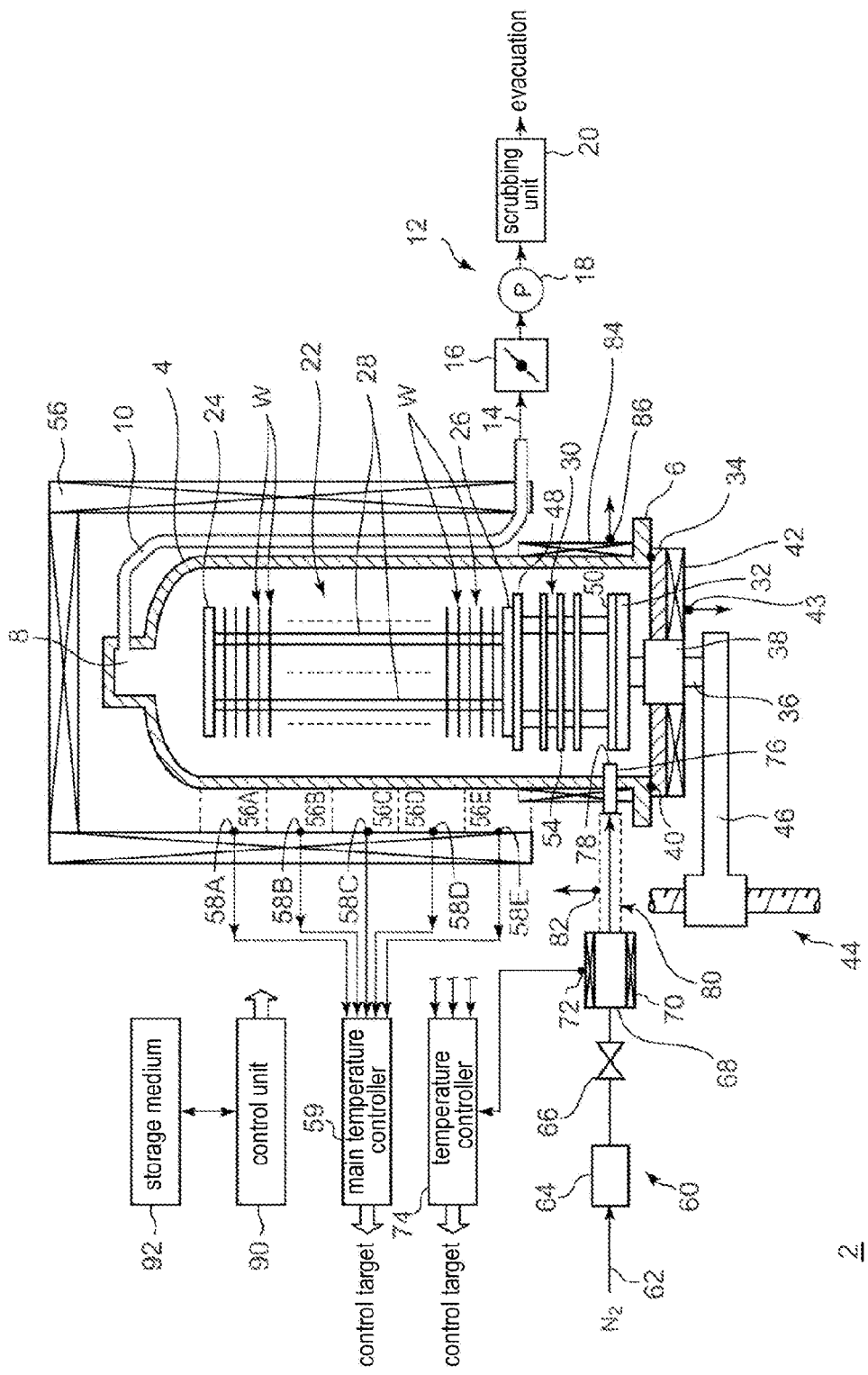
FIG. 1 shows one example of a heat treatment apparatus according to the present disclosure.
Figure 2:
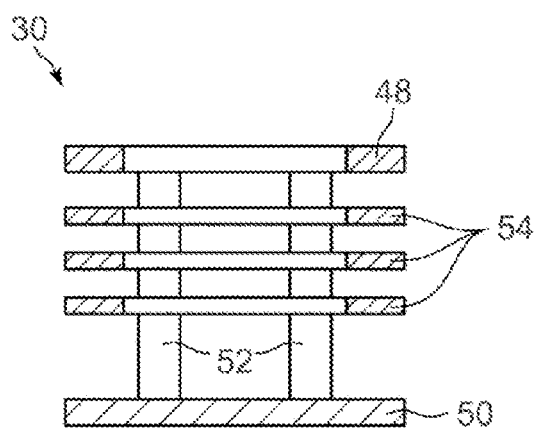
FIG. 2 is a sectional view showing one example of a heat insulation unit in the heat treatment apparatus of FIG. 1.

FIG. 1 shows one example of the heat treatment apparatus 2 according to the present disclosure. FIG. 2 is a sectional view showing one example of a heat insulation unit 30 in the heat treatment apparatus of FIG. 1.

As shown in FIG. 1, the heat treatment apparatus 2 has a batch-type, vertically long processing container 4 having a drum shape with a bottom open. The processing container 4 is made of, for example, quartz having a high thermal resistance and formed into a cylindrical shape. A flange portion 6 is formed at the bottom of the processing container 4 and an upwardly protruding exhaust chamber 8 is formed at the top of the processing container 4. An exhaust pipe 10 made of, for example, quartz, extends from the exhaust chamber 8. The exhaust pipe 10 extends downward along the outer wall of the processing container 4 and then is bent horizontally at a bottom of the processing container 4. An exhaust system 12 is connected to the exhaust pipe 10 and evacuates the inner atmosphere of the processing container 4.

The exhaust system 12 has an exhaust passage 14 made of, for example, stainless steel and connected to a leading end of the exhaust pipe 10. A pressure control valve 16, an exhaust pump 18, and a scrubbing unit 20 are sequentially aligned along the downward direction of the exhaust passage 14 (i.e., from the upstream side to the downstream side in the exhaust passage 14). The inner pressure of the processing container 4 may be adjusted by controlling the pressure control valve 16. An ejector, for example, may be used as the exhaust pump 18. The exhaust pump 18 may be entirely omitted when the processing pressure approximates to an atmospheric pressure. The scrubbing unit 20 is configured to remove harmful substances contained in an exhaust gas.

A wafer boat 22, which serves as a holding unit for holding a plurality of semiconductor wafers W as target objects, is vertically inserted (i.e., loaded) into or ejected (i.e., unloaded) from the bottom opening of the processing container 4. The wafer boat 22 is entirely made of, for example, quartz. Specifically, the wafer boat 22 has a ceiling plate 24, a bottom plate 26 and a plurality of supports, for example, four supports 28, disposed between the ceiling plate 24 and the bottom plate 26 (only two supports are shown in FIG. 1).

Supporting grooves (not shown) are formed on each of supports 28 at a predetermined pitch and peripheral portions of the semiconductor wafers W are supported by the supporting grooves, so that the semiconductor wafers W are held by the wafer boat 22 in multi-levels. The semiconductor wafers W can be inserted into and ejected from the wafer boat 22 in a horizontal direction. The wafer boat 22 may accommodate, for example, 50 to 150 sheets of the semiconductor wafers W having a diameter of 300 mm.

The wafer boat 22 is mounted on a table 32 via a heat insulation unit 30 made of quartz. The table 32 is installed on an upper end of a rotating shaft 36 penetrating through a lid 34 which opens and closes the bottom opening of the processing container 4. The rotating shaft 36 is air-tightly sealed and rotatably supported by, for example, a magnetic fluid seal 38 interposed between the rotating shaft 36 and a through portion of the lid 34. Further, a seal member 40, which may be an O-ring, is interposed between the periphery portion of the lid 34 and the flange portion 6 of the processing container 4 such that the processing container 4 maintains a sealing property.

A lid heating unit 42 for heating the lid 34 is installed in the lid 34. A fourth temperature measuring unit 43, for example, a thermocouple, is installed in the lid heating unit 42 such that it measures a temperature of the lid heating unit 42 (a first to a third temperature measuring unit will be described later). The rotating shaft 36 is installed on a leading end of an arm 46 supported by an elevation mechanism 44 such as a boat elevator, so that the wafer boat 22 and the lid 34 may simultaneously move in vertical direction.

The heat insulation unit 30 is made of quartz in its entirety as described above. As shown in FIG. 2, the heat insulation unit 30 has an annular ceiling plate 48, a disc-like bottom plate 50, and a plurality of, for example, four supports 52 disposed between the ceiling plate 48 and the bottom plate 50 (only two supports are shown in FIG. 2). Further, a plurality of annular pins 54 is formed in the supports 52 at a predetermined pitch.

The heat insulation unit 30 accumulates heat generated from a container lower portion heating unit 84, as will be described in more detail below. Such heat accumulation prevents excessive temperature drop at a bottom region of the wafer boat 22. Although the heat insulation unit 30 and the wafer boat 22 are separate and distinct features/components as shown in FIGS. 1 and 2, they may be combined into a single body made of quartz. Alternatively, the heat insulation unit 30 may be a cylindrical thermal insulation container made of quartz.

A cylindrical heating unit 56 having a heater made of carbon wires is installed to surround an upper outer periphery and the top of the processing container 4, thereby heating the semiconductor wafers W accommodated in the processing container 4. The heating unit 56 is divided into a plurality of, for example, five heating zones 56A to 56E corresponding to wafer receiving regions as shown in FIG. 1. Container temperature measuring units 58A to 58E, for example, thermocouples, are installed in their corresponding heating zones 56A to 56E, respectively. Temperatures measured from the container temperature measuring units 58A to 58E are input into a main temperature controller 59 to feedback-control the temperatures in the heating zones 56A to 56E independently.

A gas supply system 60, which supplies gases for use in the heat treatment, is connected to the lower portion of the processing container 4. The gas supply system 60 has an inert gas passage 62 through which a $N_2$ gas flows. A flow rate controller 64 such as a mass flow controller, an opening/closing valve 66, and an inert gas heating unit 68 for heating the inert gas flowing through the gas passage 62 are aligned sequentially in downward direction along the inert gas passage 62 (i.e., from the upstream side to the downstream side in the gas passage 62).

The inert gas heating unit 68 has a heater 70 for heating the $N_2$ gas as the inert gas up to a predetermined temperature. The predetermined temperature of the $N_2$ gas to be heated may be set to the same temperature as, for example, about the processing temperature. Further, a first temperature measuring unit 72, for example, a thermocouple, is installed in the inert gas heating unit 68. Temperatures measured by the first temperature measuring unit 72 are transmitted to a temperature controller 74. Then, the heater 70 is feed-back controlled. The most downstream side of the inert gas passage 62 is connected to a gas nozzle 76, which penetrates through a side wall at the lower portion of the processing container 4, to introduce the $N_2$ gas into the lower region of the processing container 4.

The gas nozzle 76 forms a gas introducing unit such that gas injection holes 78 of the gas nozzle 76 faces a lower portion of the heat insulation unit 30. A heat insulation heater 80, for example, a tape heater, is installed along the inert gas passage 62 between the inert gas heating unit 68 and the processing container 4, i.e., the gas nozzle 76, thereby heat-insulating the heated $N_2$ gas flowing through the inert gas passage 62.

As a result, it is possible to introduce the $N_2$ gas heated up to, for example, about the processing temperature into the lower region of the processing container 4. Further, a second temperature measuring unit 82, for example, a thermocouple, is installed in the heat insulation heater 80 and temperatures measured at the second temperature measuring unit 82 are transmitted to the temperature controller 74. Then, the heat insulation heater 80 is feedback-controlled and performs a temperature control.

In the lower portion of the processing container 4, a container lower portion heating unit 84 is installed along a circumferential direction of the lower portion of the processing container 4. The container lower portion heating unit 84 is configured to heat the $N_2$ gas as the inert gas introduced into the processing container 4 and to heat the heat insulation unit 30 positioned in the processing container 4. The container lower portion heating unit 84 is, for example, a resistance heater and disposed to surround the heat insulation unit 30. The container lower portion heating unit 84 is in a form of a band shape along a lower, outer periphery of the processing container 4 so as to cover the entire heat insulation unit 30 along a vertical direction.

A third temperature measuring unit 86, for example, a thermocouple, is installed in the container lower portion heating unit 84 and temperatures measured at the third temperature measuring unit 86 are transmitted to the temperature controller 74. Then the container lower portion heating unit 84 is feedback-controlled and performs a temperature control. The temperature of the container lower portion heating unit 84 is set to the same temperatures as, for example, about the processing temperature. Rather than being in a form of separate feature/component, the temperature controller 74 and the main temperature controller 59 may be combined into a single feature using a microcomputer or the like.

Referring back to FIG. 1, a control unit 90, for example, a microcomputer or the like, is installed in the heat treatment apparatus 2. The control unit 90 controls the gas supply amount, the processing temperature, the processing pressure or the like and overall operations of the heat treatment apparatus 2. The control unit 90 has a storage medium 92 for storing programs for use in controlling operations of the heat treatment apparatus 2.

The storage medium 92 may include, for example, a flexible disc, a compact disc (CD), a hard disc, a flash memory, a DVD or the like. Although not shown in the drawings, a user interface using a private line may be used to input instructions, programs and the like into the control unit 90. The main temperature controller 59 and the temperature controller 74 may operate under control of the control unit 90.

Hereinafter, a heat treatment carried out by using the heat treatment apparatus 2 as configured above will be described. Each operation to be described below is carried out by the control unit 90, a computer as described above.

In an actual heat treatment, in a state where the semiconductor wafers W to be processed, for example, the silicon substrates, are supported on the wafer boat 22 in multi-levels, the semiconductor wafers W are inserted from the lower portion of the processing container 4 and air-tightly accommodated in the processing container 4 preheated in advance, for example, to 100 degrees C. For example, about 50 to 150 sheets of semiconductor wafers W having a diameter of 300 mm are accommodated in the processing container 4. Surfaces of the semiconductor wafers W are coated by a photoresist and pre-baked as a pretreatment process.

The inner atmosphere of the processing container 4 is always evacuated and pressure-controlled by the exhaust system 12 during the heat treatment. The semiconductor wafers W rotate a predetermined number of revolutions during the heat treatment when the wafer boat 22 rotates. Further, the $N_2$ gas as the inert gas is introduced into the processing container 4 from the gas nozzle 76 disposed at the lower portion of the processing container 4 by the gas supply system 60, and an electric power applied to the heating unit 56 increases until the temperatures of the processing container 4 and the semiconductor wafers W reach the processing temperature, for example, about 150 to 200 degrees C. At the processing temperature, the photoresists on the surface of the semiconductor wafers W are baked. That is, moistures, solvents or the like contained in the photoresists are evaporated and solidified. At this time, the processing pressure may range, for example, from the atmospheric pressure to 500 Torr.

Thus, generated moistures, the solvents or the like move together with the $N_2$ gas while the $N_2$ gas introduced from the gas nozzle 76 at the lower portion of the processing container 4 flows upward in the processing container 4. The $N_2$ gas containing the moistures, the solvents or the like reaches the top of the processing container 4 and then is evacuated from the exhaust chamber 8 to the outside of the processing container 4, thereby flowing through the exhaust pipe 10 and the exhaust passage 14 of the exhaust system 12.

In the conventional heat treatment apparatus, since the $N_2$ gas of about atmospheric temperature is introduced into the lower region in the processing container and the lower region becomes a low temperature region in a cold spot state, powdered or liquefied depositions, which is formed due to a condense of vaporized gas containing sensitizer components of the photoresist, are adhered on, for example, the surfaces of the thermal insulation container positioned in the lower region. However, an occurrence of such a deposition can be suppressed according to the present disclosure. Specifically, the $N_2$ gas flowing through the inert gas passage 62 of the gas supply system 60 is heated in advance to a predetermined temperature, for example, the substantially same temperature as or the slightly lower temperature than the processing temperature, by the inert gas heating unit 68 installed in the inert gas passage 62. Then, the heated $N_2$ gas is introduced from the injection holes 78 formed at the leading end of the gas nozzle 76 into the processing container 4.

As such, since the $N_2$ gas is heated in advance to a temperature higher than the predetermined temperature, it is possible to suppress the occurrence of the cold spot and the adherence of the depositions on the pins 54 or the supports 52 of the heat insulation unit 30 or on the inner wall at the lower portion of the processing container 4.

Accordingly, it is not only possible to suppress an occurrence of the particles due to the depositions but also possible to prolong a maintenance cycle such as wet cleaning or the like. In particular, if the adherence of the depositions is completely prevented, maintenance operations need not to be performed. In addition, since the heat insulation heater 80 is installed at the downstream side in the inert gas passage 62 with respect to the inert gas heating unit 68 in order to heat the $N_2$ gas flowing in the inert gas passage 62, the $N_2$ gas heated by the inert gas heating unit 68 can be introduced into the processing container 4 without being subjected to a decrease in temperature.

Further, since the lid 34 disposed at the bottom of the processing container 4 is heated by the lid heating unit 42, it is possible to prevent the adherence of the depositions on the inner surface of the lid 34. The container lower portion heating unit 84 installed in the lower portion of the processing container 4 can not only heat the $N_2$ gas introduced from the gas nozzle 76 into the processing container 4 but also heat the side wall at the lower portion of the processing container 4 and the heat insulation unit 30 positioned in the processing container 4. As a result, it is also possible to suppress the occurrence of the cold spot and the adherence of the depositions. In this case, the flow rate of the $N_2$ gas depends on a capacity of the processing container 4, but may range, for example, from about 10 to 20 L/min.

During the heat treatment, temperatures measured by the temperature measuring units 58A to 58E installed in corresponding one of the heating zones 56A to 56E of the heating unit 56, respectively, are transmitted to the main temperature controller 59, so that the heaters in the heating unit 56 corresponding to one of the heating zones 56A to 56E, respectively, are feedback-controlled as control targets and the heating zones 56A to 56E are temperature-controlled independently at the predetermined temperatures.

Similarly, temperatures measured by the first to the fourth temperature measuring unit 72, 82, 86 and 43 are transmitted to the temperature controller 74, such that the inert gas heating unit 68, the heat insulation heater 80, the container lower portion heating unit 84, and the lid heating unit 42 are feedback-controlled independently as control targets to be maintained at the predetermined temperatures.

According to the present disclosure, since the $N_2$ gas as the inert gas is heated before being introduced into the processing container 4 as described above, it is possible to suppress the adherence of powdered or liquefied depositions on the lower region of the processing container 4. If the processing temperature is kept constant during the heat treatment, the heating zones 56A to 56E in the heating unit 56 are independently controlled to maintain their constant temperatures, respectively. Further, the control targets of the temperature controller 74, i.e., the inert gas heating unit 68, the heat insulation heater 80, the container lower portion heating unit 84, and the lid heating unit 42, are also independently controlled to maintain constant temperatures, respectively.

Depending on the types of photoresist, the processing temperature needs to be changed during the baking process during the heat treatment. For example, a photoresist may exist that is required to be processed, for example, at 150 degrees C. for a period T1 and then processed, for example, at 250 degrees C. for a period T2 during the baking process.

Figure 3:
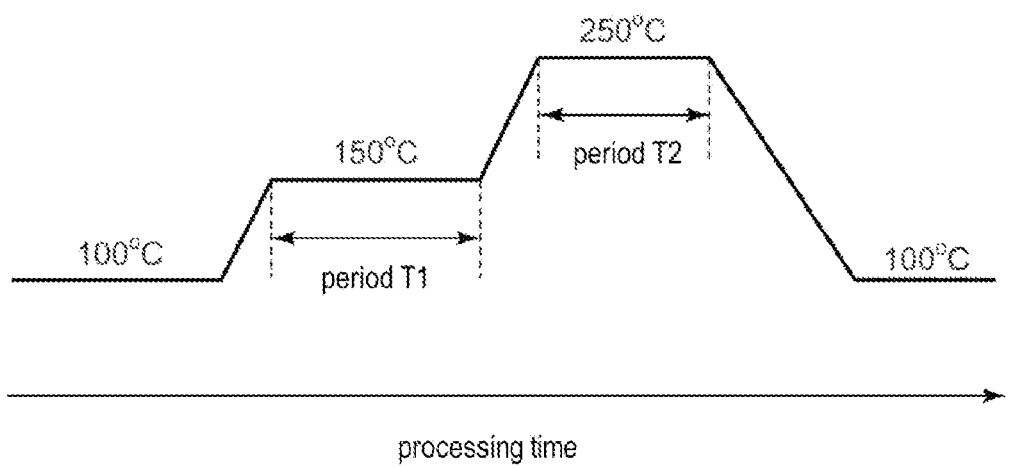
FIG. 3 shows one example of changes of a processing temperature in a heat treatment apparatus when processing a photoresist that requires changes in processing temperature during a baking process.

FIG. 3 shows one example of the processing temperature change in the heat treatment apparatus when a photoresist processing requires processing temperature change during a baking process. As shown in FIG. 3, the temperature of the processing container 4, i.e., the processing temperature, has a profile as follows:

1. During a preheating process, the processing temperature is maintained at 100 degrees C.,
2. During a heat treatment of the photoresist, the processing temperature is maintained at a predetermined value of 150 degrees C. for a period T1 and then increased to a predetermined values of 250 degrees C. for a period T2, and
3. After the heat treatment, the processing temperature decreases to be maintained again at 100 degrees C.

When the heat treatment is carried out based on a recipe using the aforementioned temperature profile, the main temperature controller 59 controls the heating unit 56 as the control targets to be the respective predetermined values and the temperature controller 74 controls the inert gas heating unit 68, the heat insulation heater 80, the container lower portion heating unit 84, and the lid heating unit 42 as the control targets to follow the changes of the predetermined values. For example, the temperature controller 74 controls the temperatures of the inert gas heating unit 68, the heat insulation heater 80, the container lower portion heating unit 84, and the lid heating unit 42 are maintained at 150 degrees C. for the period T1 and then maintained at 250 degrees C. for the period T2. The temperature profile during the heat treatment shown in FIG. 3 is presented by way of example only, and the temperature profile is not limited thereto.

According to the present disclosure, when the semiconductor wafers W coated by the photoresist requiring changes in processing temperature in a stepwise manner are baked, the $N_2$ gas having the temperature following the changes in processing temperature can be introduced into the processing container 4. Thus, the semiconductor wafers W held at the lower portion of the wafer boat 22 are prevented from being exposed to the $N_2$ gas having a temperature substantially different from the predetermined temperature. As a result, heat treatment histories on all the semiconductor wafers W accommodated in the processing container 4 become identical.

Specifically, since the temperatures of the control targets are controlled to follow the changes of the predetermined during the heat treatment, the target objects positioned in the lower portion of the processing container 4 are prevented from being heat-treated at an excessively low or high temperature. Accordingly, all the target objects accommodated in the processing container 4 can have the uniform heat history.

By way of example, the lid heating unit 42, the heat insulation heater 80, and the container lower portion heating unit 84 are installed in addition to the inert gas heating unit 68 in the above embodiment. However, the lid heating unit 42, the heat insulation heater 80, and the container lower portion heating unit 84 may only be installed if necessary. For example, if the $N_2$ gas is sufficiently heated by the inert gas heating unit 68, all or some of the lid heating unit 42, the heat insulation heater 80, and the container lower portion heating unit 84 may be omitted.

By way of example, the $N_2$ gas is used as the inert gas in the above embodiments. However, the present disclosure is not limited thereto and a rare gas such as Ar, He or the like may be used as the inert gas. By way of example, the semiconductor wafers are presented as the target objects in the above embodiments. The semiconductor wafer may include silicon substrates and compound semiconductor substrates such as CaAs substrates, SiC substrates, GaN substrates, or the like. Moreover, the present disclosure is not limited to the aforementioned substrates and can be applied to glass substrates used in a liquid crystal display, ceramic substrates, or the like.

According to the present disclosure, since the inert gas is heated before being introduced into the processing container, it is possible to suppress adherence of powdered or liquefied depositions on the lower region of the processing container.

According to the present disclosure, when the predetermined values of the processing temperature are changed during the heat treatment, the temperature of the control targets is adjusted to follow the changes of the predetermined values. Thus, the target objects positioned in the lower portion of the processing container are prevented from being heat-treated at an excessively low or high temperature. As a result, all the target objects accommodated in the processing container can have the uniform heat history.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A heat treatment apparatus for performing a heat treatment on a plurality of target objects held by a holding unit by allowing an inert gas to flow upwardly in a vertical processing container with a heating unit provided in the vicinity of the processing container, the apparatus comprising:
    a main temperature control unit configured to control the heating unit;
    an inert gas passage through which the inert gas flows into the processing container;
    an inert gas heating unit installed in the inert gas passage and configured to heat the inert gas;
    a first temperature measuring unit located in the inert gas heating unit;
    a heat insulation heater installed along the inert gas passage between the inert gas heating unit and the processing container;
    a second temperature measuring unit installed in the heat insulation heater; and
    a temperature controller configured to control the inert gas heating unit and the heat insulation heater based on temperatures measured by the first and second temperature measuring units,
    wherein when predetermined values of processing temperatures vary during the heat treatment, the temperature controller controls the inert gas heating unit and the heat insulation heater to reflect changes of the predetermined values such that the target objects accommodated in the processing container can have a uniform heat history.

2. The heat treatment apparatus of claim 1, further comprising:
    a lower portion heating unit installed at a lower portion of the processing container along the circumferential direction of the processing container and configured to heat the inert gas introduced into the processing container; and
    a third temperature measuring unit installed in the lower portion heating unit,
    wherein the temperature controller is configured to control the lower portion heating unit based on temperatures measured by the third temperature measuring unit.

3. The heat treatment apparatus of claim 1, further comprising:
    a lid heating unit installed in a lid for air-tightly sealing a bottom opening of the processing container; and
    a fourth temperature measuring unit installed in the lid heating unit,
    wherein the temperature controller is configured to control the lid heating unit based on temperatures measured by the fourth temperature measuring unit.

4. The heat treatment apparatus of claim 2, further comprising:
    a lid heating unit installed in a lid for air-tightly sealing a bottom opening of the processing container; and
    a fourth temperature measuring unit installed in the lid heating unit,
    wherein the temperature controller is configured to control the lid heating unit based on temperatures measured by the fourth temperature measuring unit.

5. The heat treatment apparatus of claim 1, wherein the temperature controller is combined with the main temperature control unit.

6. The heat treatment apparatus of claim 1, wherein the heat treatment includes a sintering process for baking a photoresist formed on surfaces of the target objects.

7. A heat treatment apparatus for performing a heat treatment on a plurality of target objects held by a holding unit by allowing an inert gas to flow upwardly in a vertical processing container with a heating unit provided in the vicinity of the processing container, the apparatus comprising:
    a main temperature control unit configured to control the heating unit;
    an inert gas passage through which the inert gas flows into the processing container;
    an inert gas heating unit installed in the inert gas passage and configured to heat the inert gas;
    a first temperature measuring unit located in the inert gas heating unit;
    a heat insulation heater installed along the inert gas passage between the inert gas heating unit and the processing container;
    a second temperature measuring unit installed in the heat insulation heater;
    a lower portion heating unit installed along the circumferential direction of the processing container and configured to heat the inert gas introduced into the processing container;
    a third temperature measuring unit installed in the lower portion heating unit;
    a lid heating unit installed in a lid for air-tightly sealing a bottom opening of the processing container;
    a fourth temperature measuring unit installed in the lid heating unit; and
    a temperature controller configured to control the inert gas heating unit, the heat insulation heater, the lower portion heating unit and the lid heating unit based on temperatures measured by the first to the fourth temperature measuring units,
    wherein when predetermined values of processing temperatures vary during the heat treatment, the temperature controller controls the inert gas heating unit to reflect changes of the predetermined values such that the target objects accommodated in the processing container can have a uniform heat history, and controls at least one of the heat insulation heater, the lower portion heating unit and the lid heating unit to reflect changes of the predetermined values based on the temperatures measured by the second to the fourth temperature measuring units.

* * * * *